(12) United States Patent
Trautvetter (10) Patent No.: US 6,800,949 B1
(45) Date of Patent: Oct. 5, 2004

(54) EMBEDDED CHIP ENCLOSURE WITH SOLDER-FREE INTERCONNECT

(75) Inventor: Carl W. Trautvetter, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 273 days.

(21) Appl. No.: 10/067,445

(22) Filed: Feb. 4, 2002

(51) Int. Cl.[7] .................. H01L 23/29; H01L 23/12; H01L 23/14
(52) U.S. Cl. .................. 257/794; 257/730; 257/702; 257/701; 257/706; 257/707; 257/713; 257/785; 438/126
(58) Field of Search .................. 257/794, 730, 257/701, 702, 706, 707, 713, 785, E23.009, E23.065, E23.125, E23.178, E23.192; 438/126, 127

(56) References Cited

U.S. PATENT DOCUMENTS

| | | | | |
|---|---|---|---|---|
| 4,828,597 A | * | 5/1989 | Glascock et al. | 65/42 |
| 4,989,063 A | * | 1/1991 | Kolesar, Jr. | 257/633 |
| 5,739,585 A | * | 4/1998 | Akram et al. | 257/698 |
| 2002/0063342 A1 | * | 5/2002 | Blackshear | 257/787 |

OTHER PUBLICATIONS

Tyler, S. G. et al.; Packaging, Interconnect and Systems Integrator; GEC Review; 1999; pp 37–36; vol. 14, No. 1; U.K.
Banerjee, K.; Intel Develops Breakthough Packaging Technology; Intel Labs Webpage; Oct. 8, 2001; U.S.A.
Intel Researchers Disclose Packaging Technology Breakthrough to enable Billion–Transistor Processors; Intel Webpage; Oct. 8, 2001; U.S.A.

* cited by examiner

*Primary Examiner*—Nitin Parekh
(74) *Attorney, Agent, or Firm*—Allan Y. Lee; Michael A. Kagan; Peter A. Lipovsky (57) ABSTRACT

A fused silica substrate is processed to a thickness that allows it to be easily flexed. An opening is etched in the substrate. A die having a patterned topside is processed to the thickness of the substrate by lapping the die. The thinned die is positioned within the opening of the substrate. Non-conducting glass is then spun on top and backside surfaces of the die/substrate combination and is allowed to flow between the surfaces of the die and substrate. Conductive traces are constructed to provide electrical connection from the embedded die to the periphery of the enclosure for external electrical interconnect. The flexural properties of the thin fused silica (or equivalent) permit the enclosure to be arched and inserted into a printed circuit board without solder.

19 Claims, 15 Drawing Sheets

EMBEDDED CHIP ENCLOSURE WITH SOLDER-FREE INTERCONNECT

BACKGROUND OF THE INVENTION

This invention relates generally to what are known in the semiconductor field as chip (die) enclosures. More specifically the invention relates to an enclosure wherein one or more semiconductor die/dice are embedded within the base of the enclosure rather that on its surface. In greater specificity, the invention relates to an embedded die enclosure wherein electrical connection to the enclosure is performed through solder-free interconnects.

Enclosures for semiconductor die, sometimes referred to as packages when containing a single die and as multi-chip modules when containing plural die, fall largely into two categories. These categories are based upon enclosure "base" material. The common enclosure base is either ceramic or plastic. The way in which a semiconductor die is operably coupled to such an enclosure and the way in which the enclosure is then operably coupled to the outside world (interconnected) is largely contingent upon this enclosure material.

For typical ceramic enclosures, a semiconductor die is "die attached" to a gold film disposed on a ceramic base. In this stage, a gold/silicon eutectic solder is formed at the die/base interface. Electrical leads for the die are typically configured into an electrical lead frame that is embedded in glass disposed at the periphery of the ceramic base. The bonding pads of the semiconductor die are then bonded to the "fingers" of the electrical lead frame, using ultrasonics for aluminum fingers or gold ball bonding techniques for gold wire fingers. The enclosure and die are then sealed in either a belt furnace or other sealer device using glass or a low temp solder such as gold-tin. Electrical connection of the enclosure such as to a printed circuit board is through solder connections.

For typical plastic enclosures, a semiconductor die is die attached to a gold plated pad on an electrical lead frame. A gold/silicon eutectic solder is formed at the interface. Gold wire is then gold ball bonded from the aluminum bonding pads of the semiconductor die to the "fingers" of the electrical lead frame. The structure is then encapsulated with an "epoxy encapsulant", such as in a traditional hot-press transfer-molding machine. As with ceramic enclosures, electrical connection to the plastic-based enclosure is through solder connections.

Either of the above-two designs have their limitations.

In the ceramic enclosure field, die attach temperatures are typically greater than 400° C. While these temperatures have allowed successful ceramic enclosure operation, lower processing temperatures are desirable to enhance quality and reliability.

The electrical lead frames used in ceramic enclosures are relatively expensive. In addition, the combination of gold plated lead frame fingers and die aluminum bonding pads leads to a potential long term reliability problem in the form of purple plague/intermetallics and Kirkendall voiding. Further, the wire bonding process requires one wire to be bonded at a time. This is a relatively costly endeavor.

As with all enclosures containing a void therein, there is a possibility of conductive particles (contaminants) becoming inadvertently sealed within the enclosure. These particles have the potential of shorting elements of the enclosed electronics. Finally, the sealing process itself is typically done at high temperatures of about 400° C. As with die attach temperatures, lowering the seal processing temperatures is desirable to improve quality and reliability.

As described, the enclosure is typically electrically interconnected to components outside the enclosure by soldering the enclosure's leads to printed circuit boards. If this soldering process is not precisely performed, problems with temperature and solder cracking may result.

Plastic enclosures have drawbacks as well. Data indicates that the epoxy encapsulant materials used with these enclosures contain additives that due to the close proximity to the semiconductor die create degradation of the device during all radiations levels. It is also known that gold ball bonding to aluminum bonding pads presents a potential long term reliability problem in plastic enclosures. This is due to both a bimetallic system and the presence of additive materials of the epoxy encapsulant. These problems embody themselves in the form of purple plague, inter-metallics and Kirkendall voiding.

Plastic enclosed modules also experience what is termed "popcorning," where internal enclosure delamination occurs due to moisture and soldering temperatures, creating enclosure cracking and electrical problems.

Finally, as with ceramic enclosures, the solder interconnections by which the enclosure is electrically connected to its outside world must be precisely performed. If done imprecisely, temperature and solder cracking problems may result.

To overcome the difficulties and drawbacks of prior art ceramic and plastic enclosure designs, a radically new approach to the enclosure art is needed. The new enclosure design should find a way to dispose of the complexities and temperatures of traditional die attach and sealing methods. The new approach should discard the wire bonding techniques necessary to attach the die to its electrical lead frame. The approach should ideally do away with traditional electrical lead frames altogether and their need for solder interconnection to printed circuit boards.

SUMMARY OF THE INVENTION

An example of the invention begins with a thin fused silica substrate, such as one made from quartz. The substrate is processed to a thickness that allows it to be easily flexed. The substrate is then mettalicized on its major planar surfaces. Through techniques such as those used in the tuning fork industry, an opening is etched in the silica substrate. The substrate is then cleaned of its mettalicized layers.

A die having a patterned topside is then processed to the thickness of the substrate by lapping the opposite side (backside) of the die. Using conventional "pick and place" equipment, the thinned die is positioned within the opening of the substrate. The substrate with die-in-place is mounted on a spinner to enable glass to be spun on both the top and backside surfaces of the die/substrate combination. The low-viscosity spun-on-glass flows not only on these surfaces but also between the die and the substrate.

Traditional processing techniques are then used to remove the spun-on-glass lying over the patterned bonding pads of the die. For enhanced thermal characteristics, at least a portion of the backside spun-on-glass can also be removed where it lies adjacent to the die.

The oxide $AL_2O_3$ on the aluminum bonding pads of the die is then removed, such as with an eximer laser or equivalent in a vacuum system. After a sputter etch or equivalent in the pumped down system, aluminum is deposited over the entire topside of the structure, making good ohmic contact to the $AL_2O_3$—free bonding pads.

Using traditional techniques, conductive traces are then constructed to provide electrical connection from the bonding pads of the embedded die to the periphery of the enclosure for external electrical interconnect. Since spacing is not dictated by traditional bonding pad sizes and wire bonding requirements, it is possible to provide a greater number of connectivity lines per chip side. Metal may also be deposited on the backside of the enclosure for enhanced thermal heat dissipation.

The flexural properties of the thin fused silica (or equivalent) permit the enclosure to be made arcuate (non-linear) and thereby inserted into a PCB board without solder, making good ohmic interconnect contact by way of a pressure fit. Multi-sided enclosures and even circular enclosures are envisioned to be able to be mounted in this manner.

As a final processing step, a metal such as copper may be applied to the aluminum traces at the outer edges of the enclosure where the enclosure's leads will be interconnected with components "outside" of the enclosure.

An object of this invention is to provide a die enclosure wherein traditional die attach methods are not required.

A further object of this invention is to provide a die enclosure wherein the typical wire bonding techniques necessary to attach the die to its electrical lead frame are made unnecessary.

Still another object of this invention is to provide a die enclosure that does away with traditional electrical lead frames.

Still yet another object of this invention is to provide a die enclosure that does not require the use of solder for interconnecting the die of the enclosure with electronics laying outside of the enclosure.

Other objects, advantages and new features of the invention will become apparent from the following detailed description of the invention when considered in conjunction with the accompanied drawings.

DESCRIPTION OF THE PREFERRED EMBODIMENT

Figure 1:
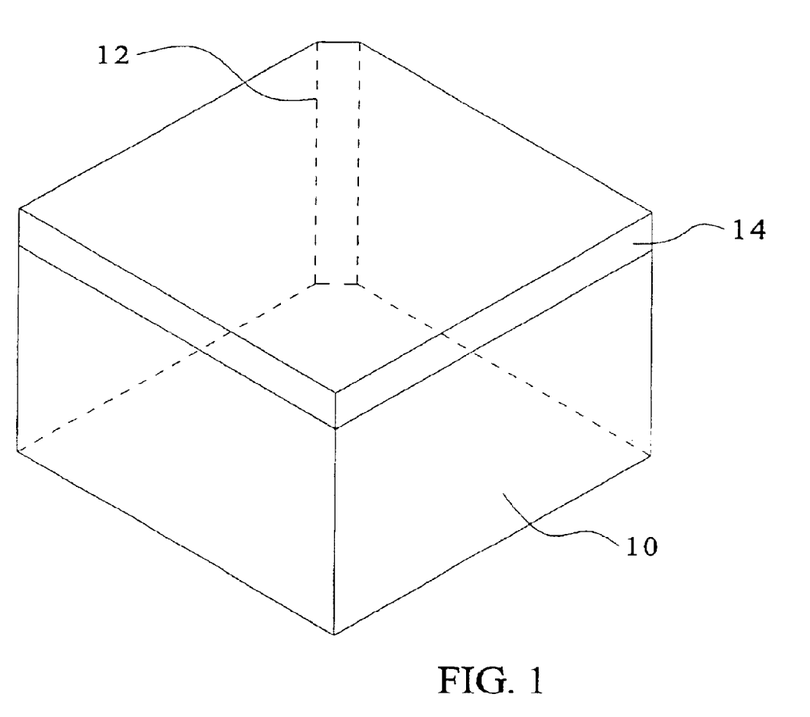
FIG. 1 is a perspective view of an exemplary block of material as can be used in the process of fabricating a single substrate according to the invention.

FIG. 1 illustrates an example process for fabricating the invention for a 0.250'×0.250'×0.021' typical complementary metal oxide semiconductor (CMOS) integrated circuit. The invention can be used for any size single device or for a multi-chip module, having both internal (between chip) and external interconnections.

The enclosure process to be described can be automated for batch process mass-production wherein dimensions may vary. The dimensions used in this description are typical and are used for example purposes.

The process begins with a 1'×1'×1' fused silica block 10 with registration notch 12. Planar substrates 14 of approximately 0.015' thickness are cut from block 10, yielding about 50 substrates. The substrates are then lapped and polished to 0.010' (typical) thickness with good flatness tolerances.

Figure 2:
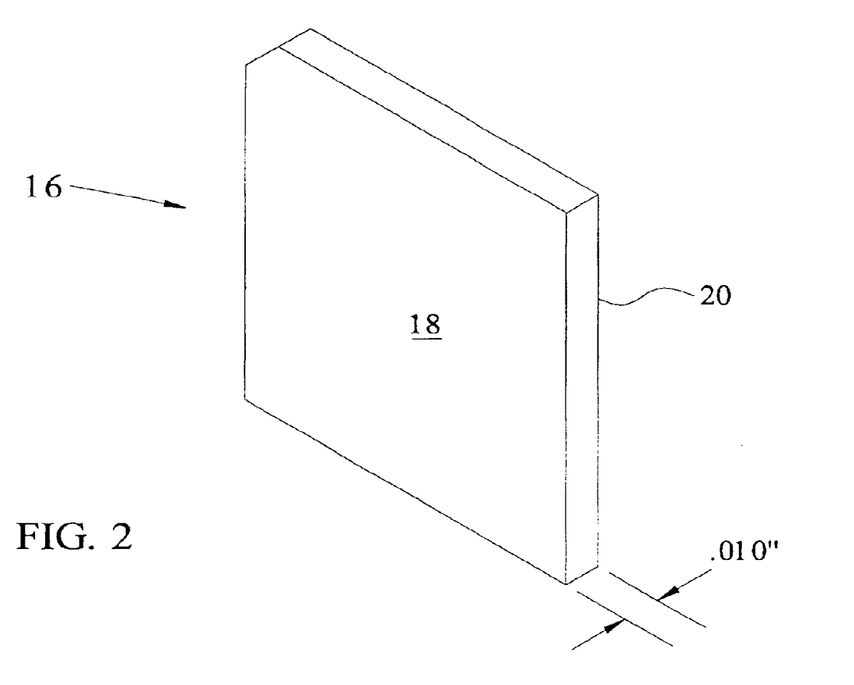
FIG. 2 illustrates an exemplary prospective view of an enclosure base as may be used in the invention.

FIG. 2 illustrates a lapped and polished substrate 16. Fused silica (quartz) when etched (scratch-free) on the order of 8 to 10 mils thick is very flexible, that is it can be flexed at least 15° without cracking or breaking. Additionally, fused silica has the same approximate thermal coefficients of expansion as deposited $SiO_2$ on semiconductors, thereby providing no abnormal stresses when matched with silicon based devices.

After the lapping and polishing of the substrate, both first and second planar sides 18 and 20 of the substrate are metallized first with a layer of chrome (approx. 200 A) followed by a layer of gold (approximately 2 KA). The other sides may also be metallized during this stage but whether this is done or not is not crucial.

Photolithographic techniques such as known to the tuning fork industry are performed on both planar sides of the substrate. These techniques are used to delineate an opening in the metal layers with the intent of providing exposed silica that will be etched to a square of approximately 0.250'× 0.250'. This size is offered by way of example. A wide variety of etching sizes are possible, for example 0.025'× 0.025' to 0.250'×0.250' and possibly larger is considered feasible.

Figure 3:
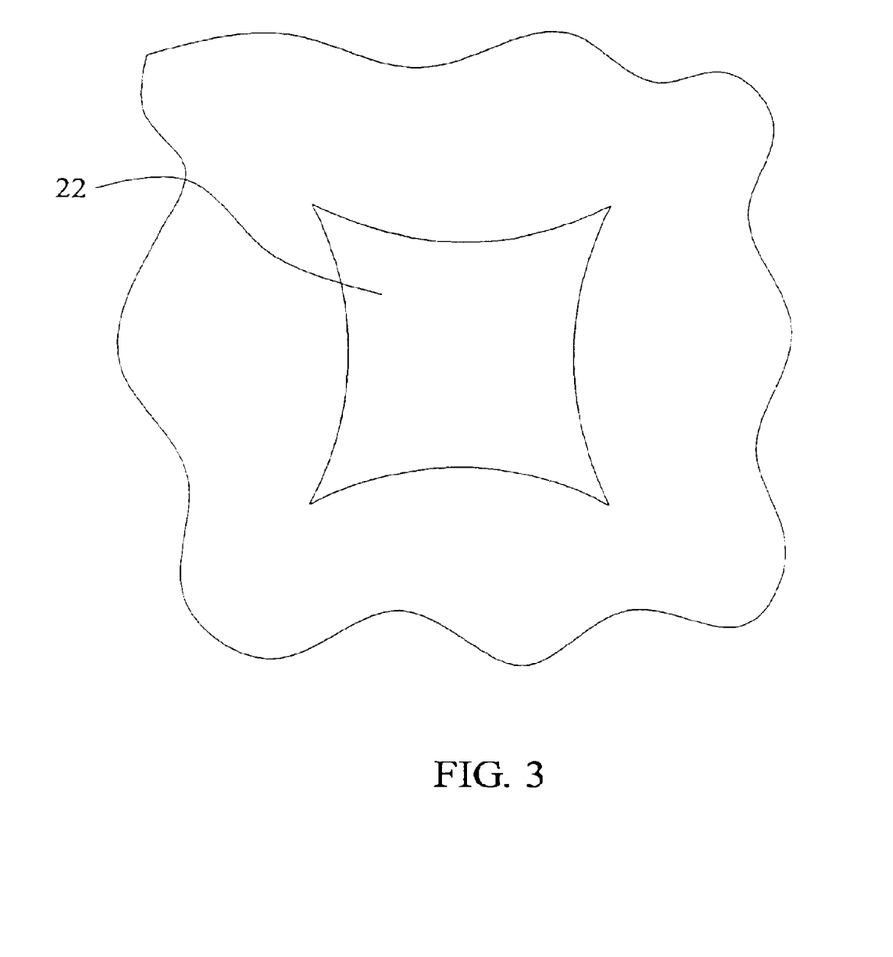
FIG. 3 illustrates by way of example hole (aperture) processing.

The opening in the metal will initially take on the form of aperture 22 in FIG. 3. The substrate is then etched in a solution such as HF or HF with ammonium. The etching should be conducted at a controlled temperature of 80 C. The rate of removing the solute into solution in the vicinity of the hole can be enhanced with agitation.

Figure 4:
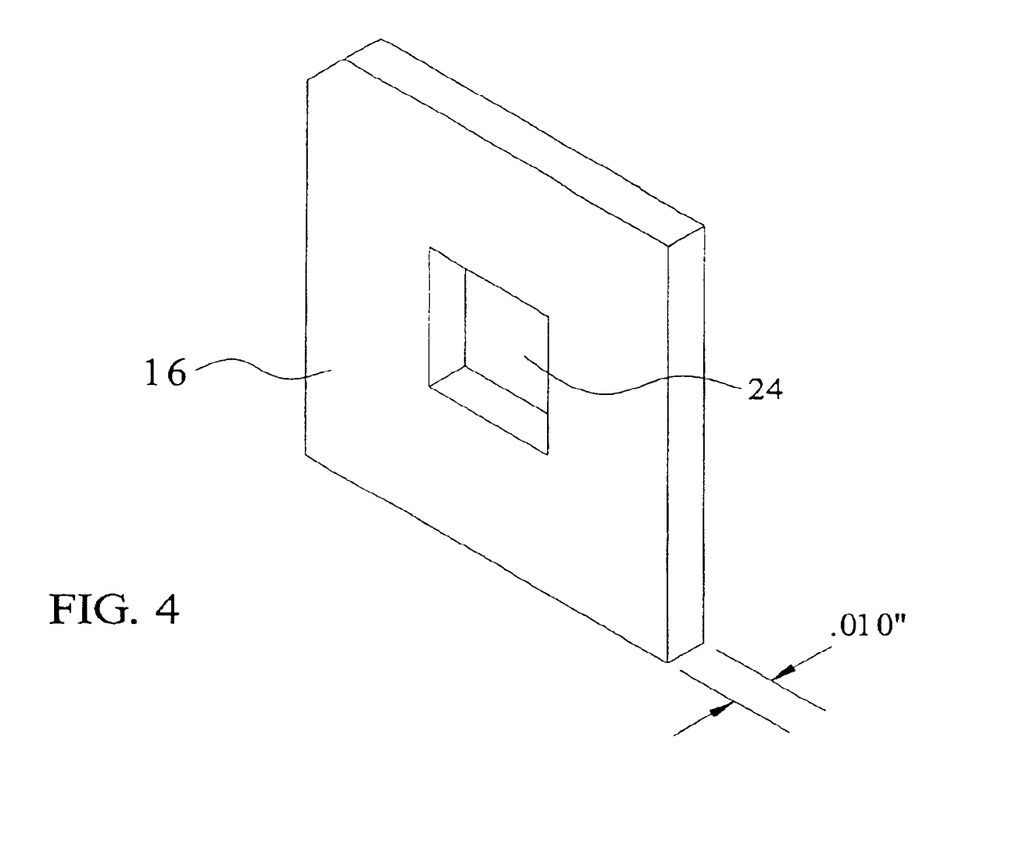
FIG. 4 illustrates a processed enclosure base with aperture according to one embodiment of the invention.

The finished product will have the appearance of the square opening 24 in substrate 16 as shown in FIG. 4. If multi-chip modules are desired, a plurality of square openings would be made in the substrate.

The next stage is to place the substrate in a solution such as aqua-regia, to promote the removal of the Cr/Au as well as a small amount of silica. Further cleansing is performed by placing the substrate in a solution such as HF or ammonium/HF, thereby removing remaining traces of chrome. The substrate should now be prepared.

The next stage of production includes processing the die and its placement in the processed substrate. In this stage, the backside or second planar side of the die (opposite to its bonding pad or first planar side) is lapped so that the thickness of completed substrate and die is approximately 8 to 10 mils.

Figure 5:
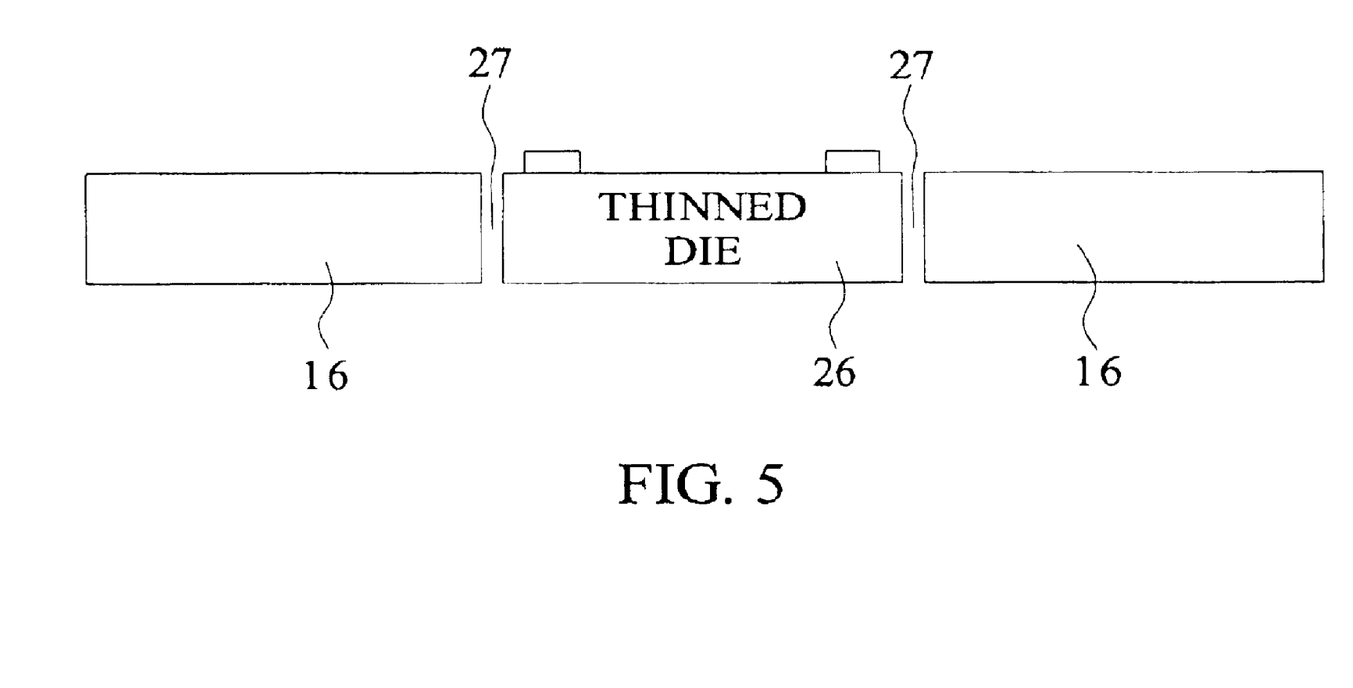
FIG. 5 is a sectioned side view of one embodiment of the invention.

Using "pick and place" equipment as is known in the art, the "thinned" die is placed in the center aperture 24 of the fused silica (quartz) substrate 16 shown in FIG. 4. FIG. 5 shows a cross-section through die 26 and the adjacent silica substrate. The distance between the die and dub substrate, shown as void 27, can be determined by the user however a typical such distance is on the order of 0.5 mils to 1.0 mil depending on registration requirements.

The next stage involves glassivation of the substrates. This can either be done in an operation involving a single substrate or a plurality of substrates. The following example is for an operation involving a plurality of substrates which lends itself to be processed as a "single" wafer using wafer fabrication techniques.

Figure 6:
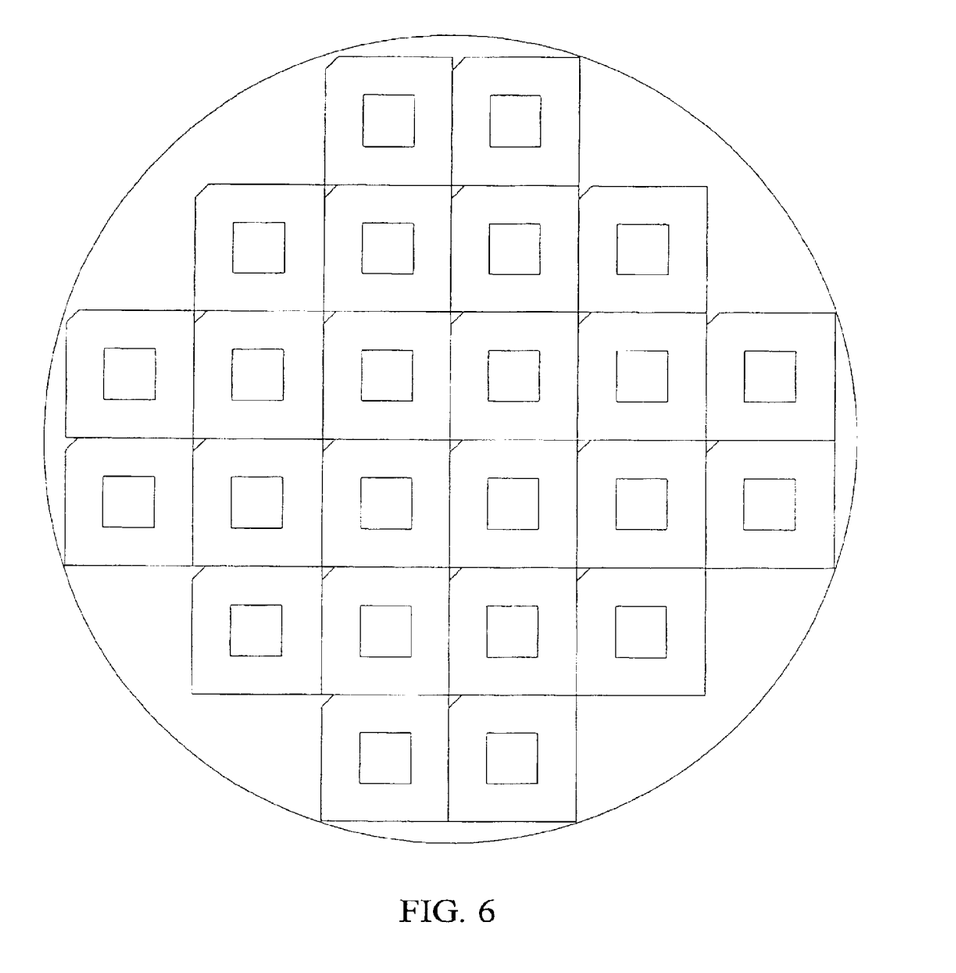
FIG. 6 illustrates an example processing step of the invention wherein a number of enclosure substrates with die are shown.

The substrates are mounted on a spinner to receive a low viscosity spun-on-glass (SOG). This operation can be a batch process wherein the number substrates processed is determined by the spinner head diameter. FIG. 6 illustrates positioning of the substrates wherein the substrates are held in place via vacuum. The substrates are positioned initially with the pattern or first planar side of the dies facing downwardly.

Figure 7:
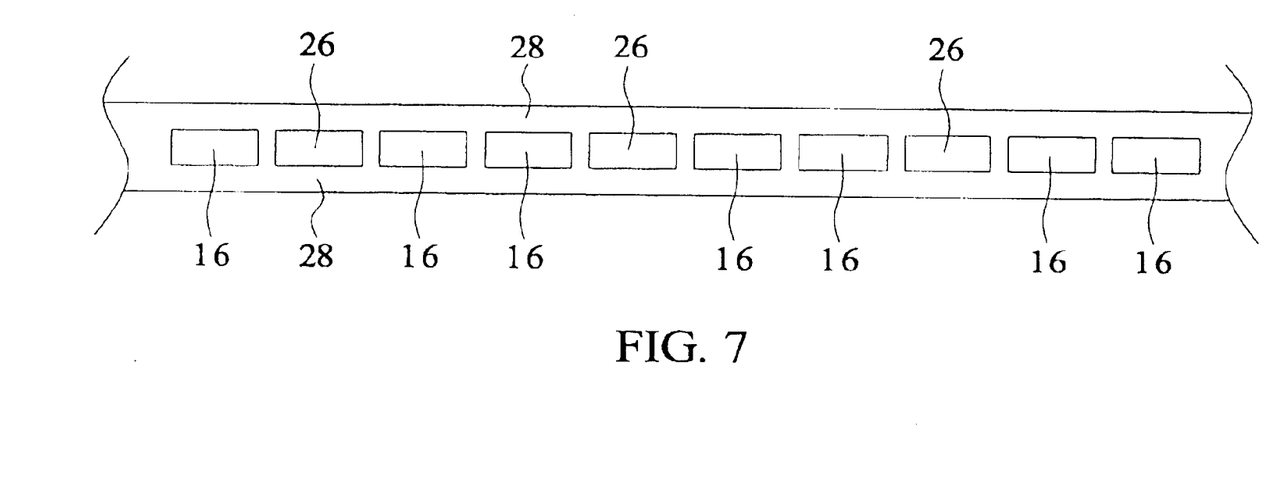
FIG. 7 is partial sectioned side view according to an embodiment of the invention.

Glass 28 is spun in a typical spun-on-glass process over the entire surface to a thickness of approximately 10 KA done at room temperature. It is then put through a traditional bake to drive off volatiles. The entire batch is then turned over to perform the same process on the patterned "frontside" of the die and substrates. When complete, the substrates and dice will look as shown in the partial cross-section of FIG. 7. In this cross-section, glass 28 is shown flowed between die 26 and adjacent substrate 16 as well as over the top and bottom surfaces of these elements.

Using traditional photolithographic techniques, the spun-on-glass laying over the bonding pads of the die is removed. Techniques such as masking and etching or e-beam writing or its equivalent, for example, can be used. The "registration" on the die/substrate combination can be used for mask alignment purposes. Approximately a 0.002'×0.002' square or 0.002' round' of glass, for example, is removed over each bonding pad 30, see FIG. 8.

Figure 8:
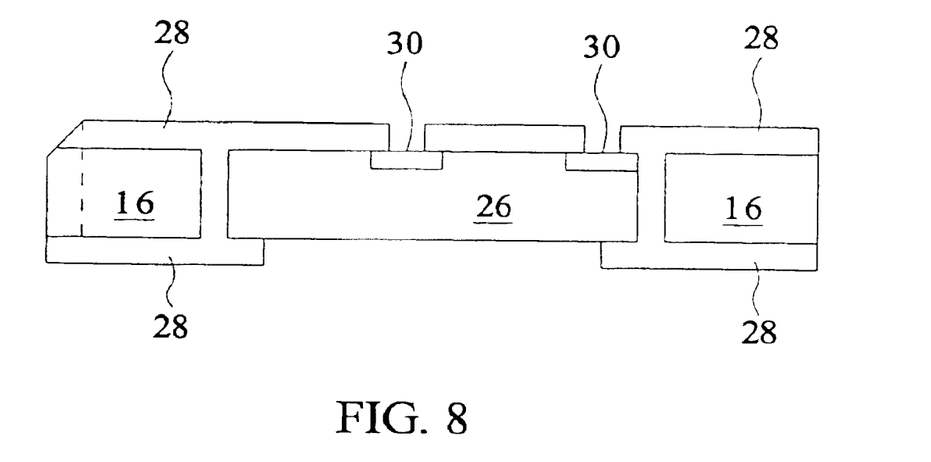
FIG. 8 is a sectioned side view of a stage in the processing of an example of the enclosure of the invention.

For enhanced thermal characteristics, SOG 28 is removed to expose the silicon backside of the die. For a 0.250'×0.250' square die, the size of the opening should be approximately 0.100' square or round.

The next processing stage includes the removal of aluminum oxide from the die bonding pads 30. Because $AL_2O_3$ forms quickly on the aluminum pads, this oxide layer should be removed before metal traces are made.

The $AL_2O_3$ is preferably removed by a pulsed laser in a pumped-down vacuum system. It may be preferable to remove existing $AL_2O_3$ outside of a vacuum system and then remove "new growth" $AL_2O_3$ in the vacuum system such as by use of a pulsed laser, back-sputtering, or other "high energy" oxide removal methods.

Figure 9:
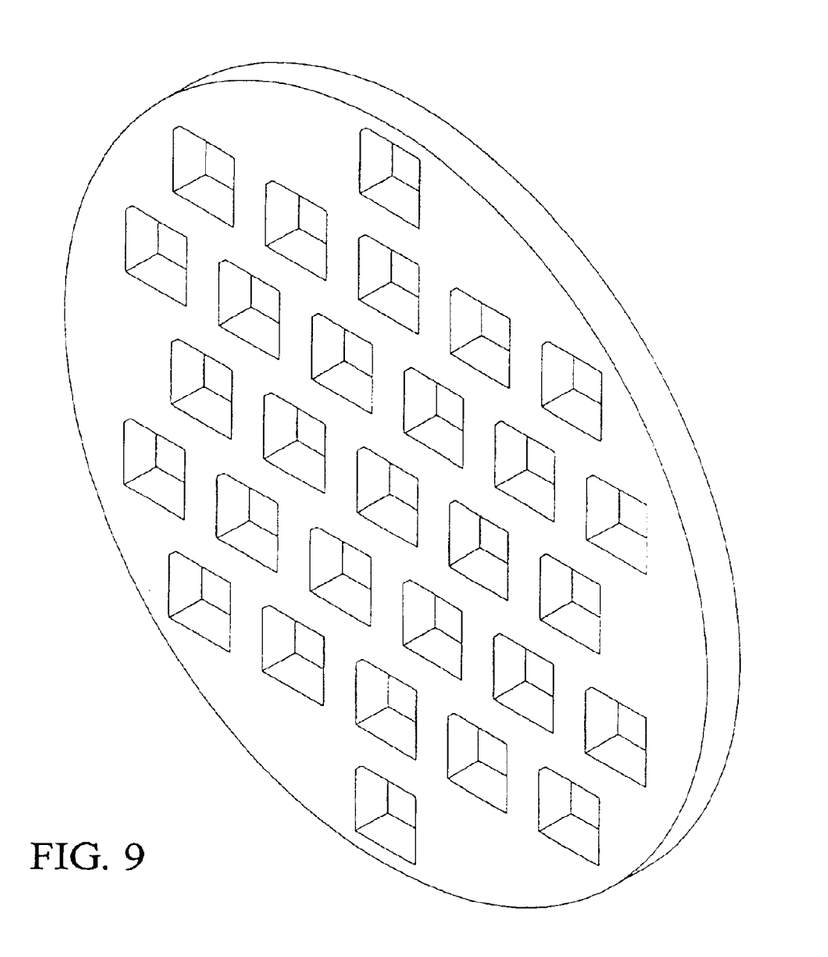
FIG. 9 shows part of a further processing stage of the invention.
Figure 10:
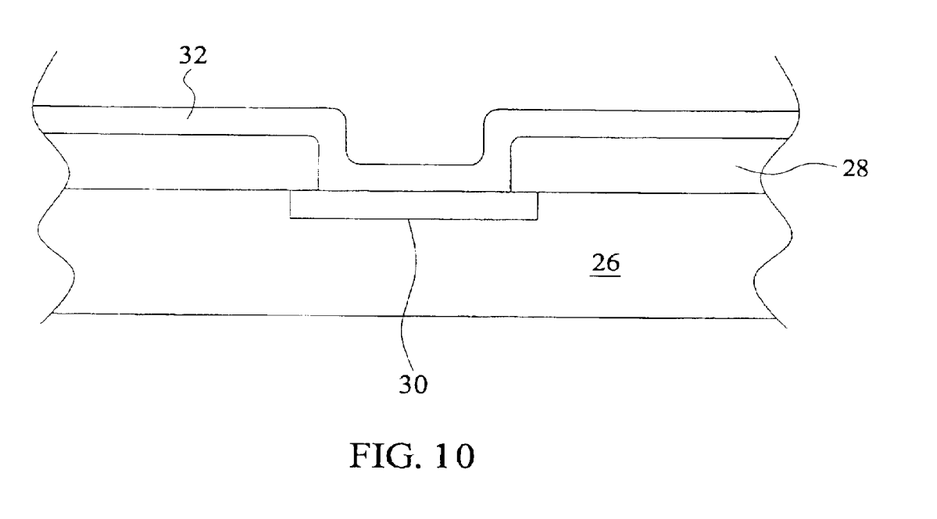
FIG. 10 is a partial sectioned side view illustrating another step in the processing of the invention.

Once nascent aluminum has been exposed on the bonding pads, an aluminum layer is deposited, such as through use of an aluminization metal mask (FIG. 9). The aluminum layer is deposited on the top (bonding pad side) of the enclosures after a sputter etch or equivalent in the pumped down system. FIG. 10 illustrates in a partial view how aluminum layer 32 is used to make good ohmic contact with the aluminum bonding pads 30 of die 26.

Figure 11A:
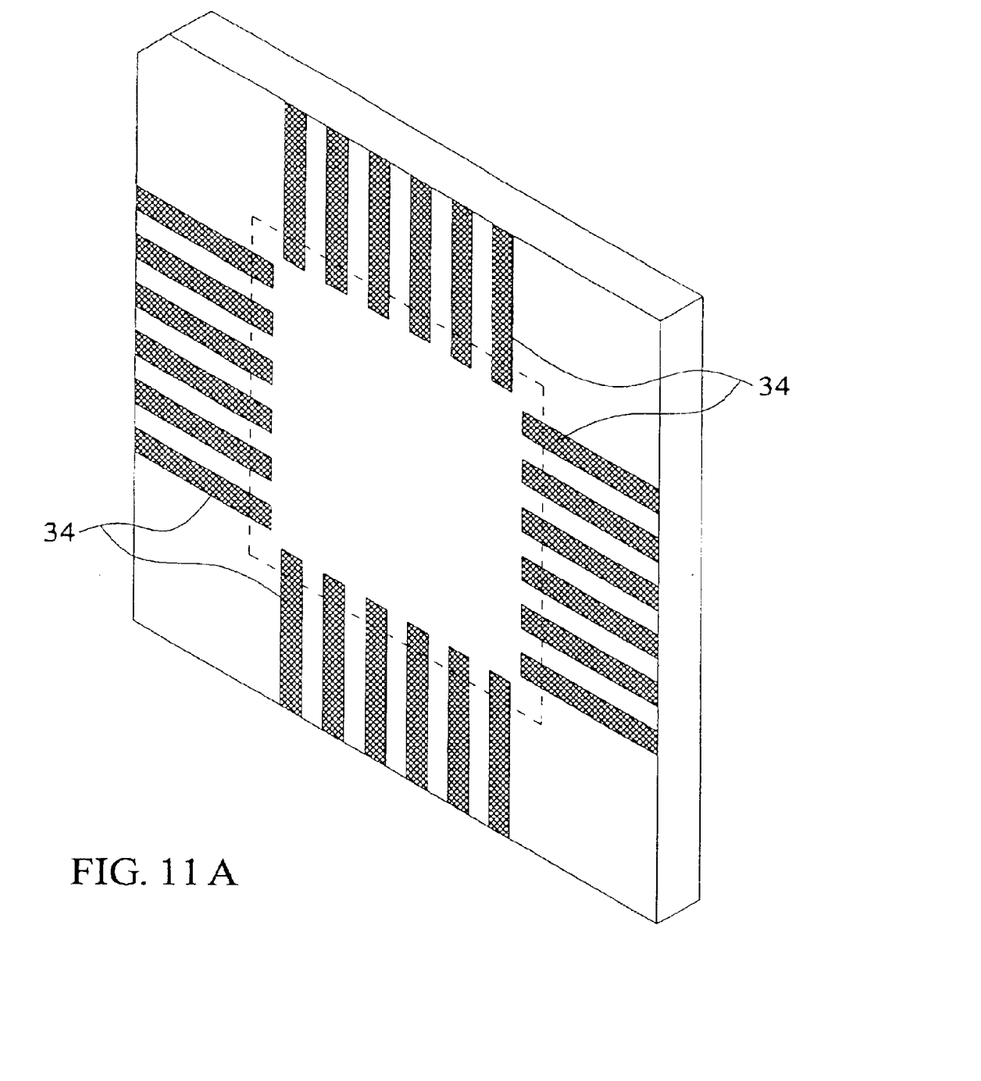
FIGS. 11A and B show top and partial side-cross sectioned views, respectively, of the embedded die enclosure according to the invention.
Figure 11B:
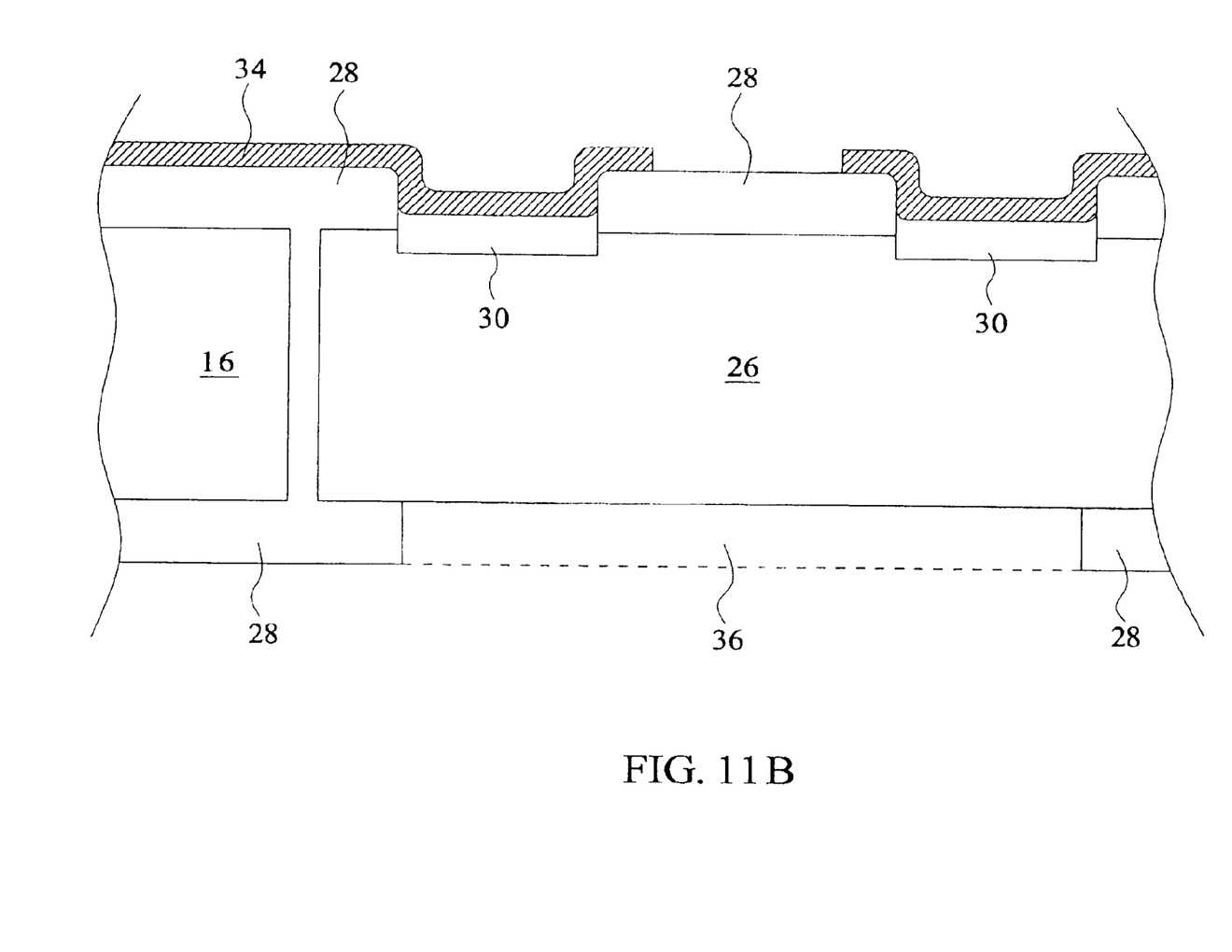

The next step includes patterning conductive traces in the newly deposited aluminum layer. Traditional techniques can be used to form aluminum conductive traces from the die bonding pads to the outer periphery of the enclosure. FIG. 11A illustrates the bonding pad side of the enclosure with conductive traces 34. FIG. 11B is a partial cross section illustrating these traces.

Described earlier is a way in which heat dissipation of the enclosure can be enhanced by removing at least a portion of the spun-on-glass from the backside of the die. When this has been done, it is possible to further enhanced heat dissipation by providing a thermal conductor in good contact to the backside of the die. FIG. 11B illustrates in ghost lines such a thermal conductor 36. Conductor 36 is deposited in a vacuum mettalization system using traditional techniques.

By using traditional wafer saw methods, or by a similar separation method, the individual substrates with die are separated. The notch is used to orientate each substrate. Handling of the glassified enclosures may be automated much in the same way that quartz tuning forks are handled and electrically tested automatically.

An attribute of the invention allows it to be electrically interconnected without solder.

Figure 12A:
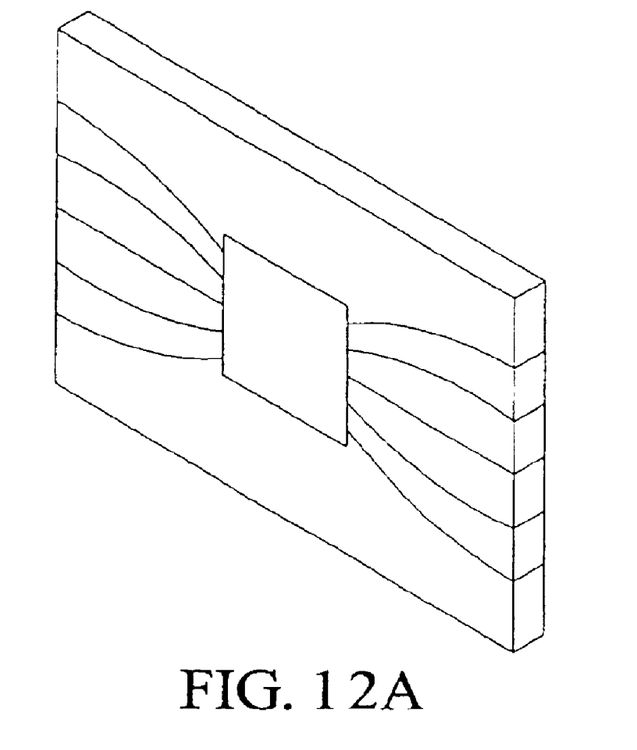
FIGS. 12A and B are representative uses of one embodiment of the invention.
Figure 12B:
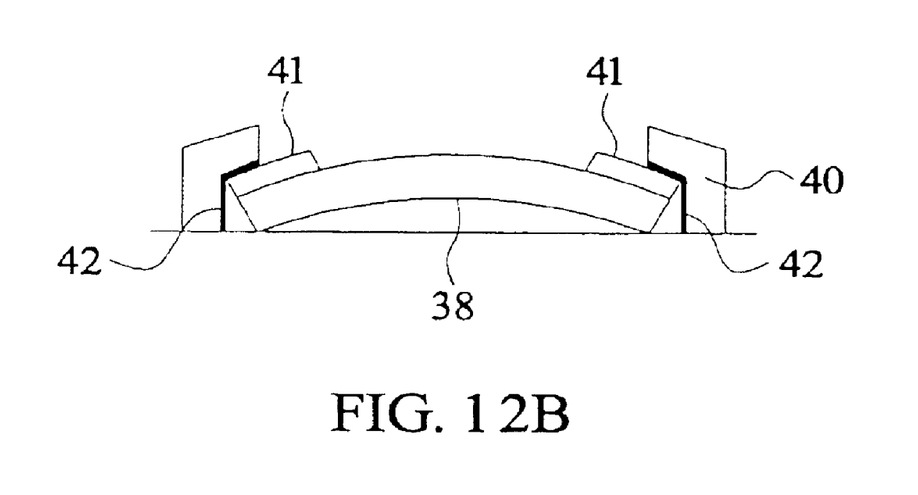

The term "interconnected" has the meaning herein that the enclosure is placed in conductive contact with electrical components lying "outside" of the enclosure. As shown in FIGS. 12A and 12B, the flexible properties of the thin fused silica (or equivalent) give enclosure 38 flexure properties so the device can be made arcuate (non-linear in shape) and inserted into a printed circuit board, for example, without the use of solder. The interconnection in such an instance is made by way of a pressure fit into an edge connector 40. Trace terminations 41 of enclosure 38 are shown in conductive contact with traces 42 of edge connector 40.

Figure 13A:
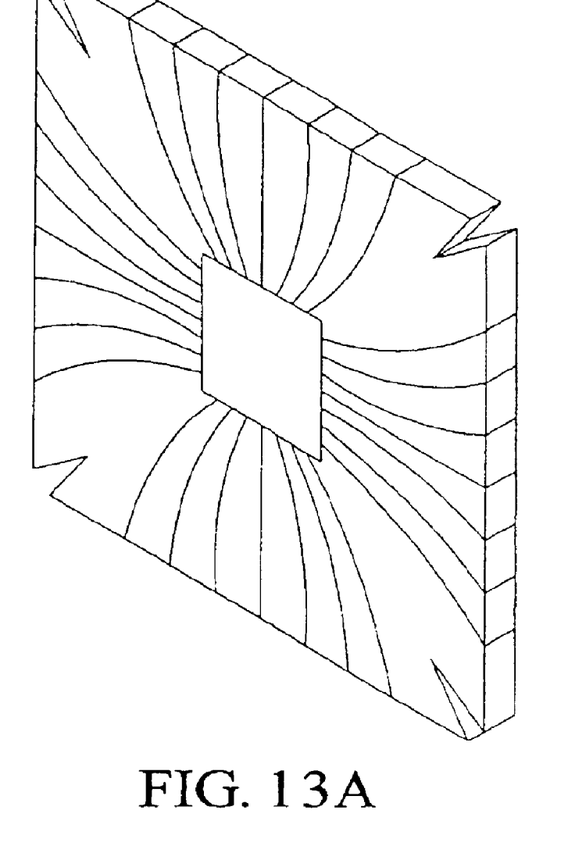
FIGS. 13A and B are representative uses of another embodiment of the invention.
Figure 13B:
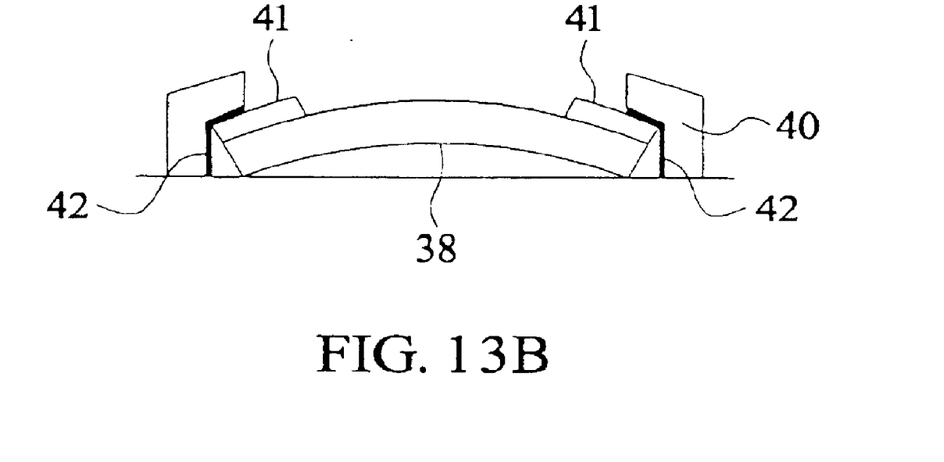

For enclosures with leads (traces) on two opposite sides, the flexure property of the enclosure will allow mounting as shown in FIGS. 12A and B, illustrating top and side views, respectively. FIGS. 13A and B illustrate top and adjacent side views, respectively, of a four lead enclosure, having two pairs of opposite sided leads both pairs of which may be brought into conductive contact with edge connector 40. Also envisioned is a circular shaped die enclosure wherein leads run to the periphery of the enclosure much like the spokes of a wheel.

For all of these embodiments, rugged conductors can be added to the aluminum traces at the outer peripheries of the enclosures and a spun-on-glass can be applied to protect exposed sections of the aluminum conductors where desired. A metal such as copper can be applied to the aluminum traces for rugged contact areas. Of course, the metal must form a good aluminum metal interface and have long-term reliability.

Figure 14A:
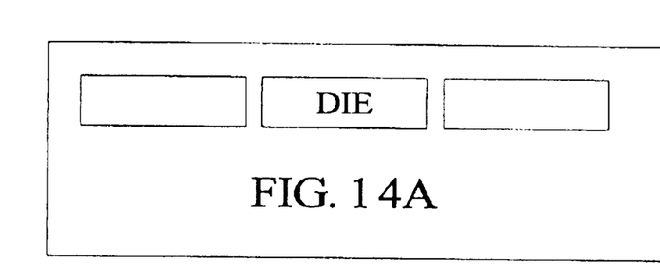
FIGS. 14A and B are representative cross-sections illustrating straight and tapered apertures, respectively, as may be used with the invention.
Figure 14B:
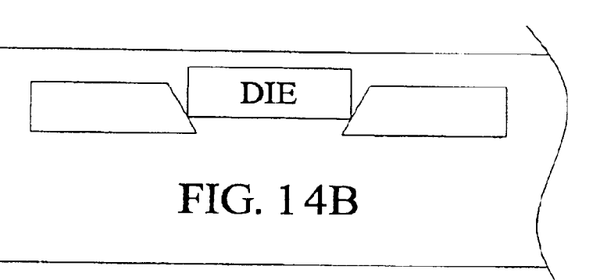

FIGS. 14A and B illustrate how the substantially orthogonal walled aperture (FIG. 14A) can be made with tapered walls (FIG. 14B) so that the die will "sit" on the tapered walls of the substrate material. This tapered design can be accomplished by traditional semiconductor processing techniques. It should also be noted that while traditional die are of a parallelogram shape, the invention is not limited to this configuration, as dies of other shapes, including disk-shaped, may be used as well.

The invention has many advantages and new features. The flexural properties of the enclosure enable the enclosure to be used as a "flat spring" that is interconnected to a board without solder, or the device can be "plugged into" a connector integrated circuit.

The enclosure of the invention is light in weight, thin and provides a hermetic almost ion free environment. It contains no lead frame and wire bonds and is assembled in relatively low temperature processing. It can be used with monometallic, narrow conductors for long-term reliability. The enclosure is radiation hard due to the lack of high "Z" materials in close proximity to semiconductor junctions, which otherwise will cause dose rate enhancement.

Obviously, many modifications and variations of the invention are possible in light of the above description. It is therefore to be understood that within the scope of the claims the invention may be practiced otherwise than as has been specifically described.

What is claimed is:

1. An enclosure apparatus comprising:
   a substrate having first and second planar surfaces and defining an aperture in said substrate through said planar surfaces;
   a die disposed within said aperture, said die having first and second planar surfaces with conductive bonding pads on said first surface of said die;
   a first layer of glass disposed over said first surfaces of said substrate and said die, said glass omitted from said bonding pads;
   a second layer of glass disposed over said second surface of said substrate and at least a portion of said second surface of said die; and
   conductive traces disposed on said first layer of glass and operably coupled to said conductive bonding pads of said die and extending to an outer periphery of said first layer of glass.

2. The enclosure of claim 1 wherein said enclosure is interconnected at said outer periphery of said enclosure through a pressure-fit interconnect.

3. The enclosure of claim 2 wherein said conductive traces are disposed from said die to opposite sides of said enclosure.

4. The enclosure of claim 3 wherein said substrate is silica.

5. The enclosure of claim 1 further including a metallic heat sink disposed on said second surface of said die.

6. The enclosure of claim 1 wherein one or more of said layers of said glass fill a void between said substrate and said die.

7. An enclosure apparatus comprising:
   a flexible substrate, said substrate having first and second planar surfaces and defining an aperture in said substrate through said planar surfaces;
   a die disposed within said aperture, said die having first and second planar surfaces with conductive bonding pads on said first surface of said die;
   a first layer of glass disposed over said first surfaces of said substrate and said die, said glass omitted from said bonding pads;
   a second layer of glass disposed over said second surface of said substrate and at least a portion of said second surface of said die; and
   conductive traces disposed on said first layer of glass and operably coupled to said conductive bonding pads of said die and extending to an outer periphery of said first layer of glass.

8. The enclosure of claim 7 wherein said enclosure is interconnected at said outer periphery of said enclosure through a pressure-fit interconnect.

9. The enclosure of claim 8 wherein one or more of said planar surfaces are made arcuate when said enclosure is interconnected.

10. The enclosure of claim 9 wherein said enclosure is interconnected at said outer periphery of said enclosure through a pressure-fit interconnect.

11. The enclosure of claim 10 wherein said conductive traces are disposed from said die to opposite sides of said enclosure.

12. The enclosure of claim 7 wherein said conductive traces are disposed from said die to opposite sides of said enclosure.

13. The enclosure of claim 7 further including a metallic heat sink disposed on said second surface of said die.

14. The enclosure of claim 7 wherein said flexible substrate is silica.

15. The enclosure of claim 7 wherein one or more of said layers of said glass fill a void between said substrate and said die.

16. A flexible enclosure apparatus comprising:
    a flexible silica substrate, said silica substrate having first and second planar surfaces and defining an aperture in said substrate through said planar surfaces;
    a die disposed within said aperture, said die having first and second planar surfaces substantially coplanar with said first and second surfaces of said silica substrate, respectively, said die having conductive bonding pads on its said first surface;
    a first layer of glass disposed over said first surfaces of said substrate and said die; said glass omitted from said bonding pads;
    a second layer of glass disposed over said second surface of said substrate and at least a portion of said second surface of said die; and conductive traces disposed on said first layer of glass and operably coupled to said conductive bonding pads of said die and extending to an outer periphery of said first layer of glass, said conductive traces making a pressure-fit interconnect at said outer periphery of said enclosure when said enclosure is interconnected and wherein one or more of said planar surfaces are made arcuate when said enclosure is interconnected.

17. The flexible enclosure of claim 16 wherein said conductive traces are disposed from said die to opposite sides of said enclosure.

18. The flexible enclosure of claim 16 further including a metallic heat sink disposed on said second surface of said die.

19. The enclosure of claim 16 wherein one or more of said layers of said glass fill a void between said substrate and said die.

* * * * *